(12) United States Patent
Pabustan et al.

(10) Patent No.: US 7,239,550 B2
(45) Date of Patent: Jul. 3, 2007

(54) METHOD OF PROGRAMMING A NON-VOLATILE MEMORY CELL

(75) Inventors: Jonathan G. Pabustan, San Lorenzo, CA (US); Ben Sheen, Milpitas, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/255,905

(22) Filed: Oct. 20, 2005

(65) Prior Publication Data

US 2007/0091688 A1    Apr. 26, 2007

(51) Int. Cl.
*G11C 11/34* (2006.01)

(52) U.S. Cl. ............... 365/185.17; 365/185.19
(58) Field of Classification Search ........... 365/185.17, 365/185.19, 185.24
See application file for complete search history.

(56) References Cited

U.S. PATENT DOCUMENTS

| 4,959,812 | A | | 9/1990 | Momodomi |
| 5,050,125 | A | | 9/1991 | Momodomi |
| 5,909,393 | A | * | 6/1999 | Tran et al. ................ 365/185.2 |
| 6,885,586 | B2 | | 4/2005 | Chen |
| 2003/0048662 | A1 | * | 3/2003 | Park et al. .............. 365/185.18 |

* cited by examiner

*Primary Examiner*—Vu A. Le
(74) *Attorney, Agent, or Firm*—DLA Piper US LLP

(57) ABSTRACT

The present invention relates to a method of a programming a select non-volatile memory cell in a plurality of serially connected non-volatile memory cells with a serially connected select transistor. Each of the non-volatile memory cells has a control gate for receiving a programming voltage and the select transistor has a select gate for receiving a select voltage. The method comprises applying the programming voltage to the control gate of the select non-volatile memory cell in a program command sequence. The magnitude of the select voltage to the select gate of the select transistor within the program command sequence is then varied. The method can be applied to non-volatile cells in a NAND or NOR architecture.

8 Claims, 3 Drawing Sheets

METHOD OF PROGRAMMING A NON-VOLATILE MEMORY CELL

TECHNICAL FIELD

The present invention relates to a method of programming a non-volatile memory cell having a control gate and a floating gate, and more particularly wherein the non-volatile memory cell has an associated select transistor in which the method of programming includes applying a programming voltage to the control gate of the non-volatile memory cell in a programming command sequence and wherein a select voltage is applied to the gate of the associated select transistor and is varied.

BACKGROUND OF THE INVENTION

Non-volatile memory integrated circuits are well known in the art. One type of a non-volatile memory cell structure is a NAND structure, which is shown in FIG. 1B. Such a structure is described in U.S. Pat. Nos. 4,959,812 and 5,050,125 whose disclosures are incorporated herein in their entirety. In this type of structure, the NAND string comprises a plurality of serially connected non-volatile floating gate memory cells, each with a control gate. At the ends of the NAND structure are two select transistor (SG0 and SGn). Each select transistor has a gate and serves to pass the programming voltage supplied to either the drain/source of the select transistor to the plurality of serially connected NAND memory cells.

Another type of NAND structure is that shown in FIG. 1A. Such a structure is described in U.S. Pat. No. 6,885,586 whose disclosure is also incorporated herein in its entirety. In this structure, each floating gate memory cell has an associated select transistor. A current limited transistor provides the current to one end of the select transistor located at one end of the NAND structure.

In either of the NAND structures shown in FIGS. 1A and 1B, controlling the programming current as well as programming speed is crucial, because of the variation in the bit line voltage due to the biasing voltage applied to the select transistor at one end of the NAND structure.

SUMMARY OF THE INVENTION

Accordingly, in the present invention, a method of programming a select non-volatile memory cell in a plurality of serially connected non-volatile memory cells having a serially connected select transistor is disclosed. Each of the non-volatile memory cells has a control gate for receiving a programming voltage and the select transistor has a select gate for receiving a select voltage. The method comprises applying the programming voltage to the control gate of the select non-volatile memory cell in a program command sequence. The magnitude of the select voltage to the select gate of the select transistor within the program command sequence is varied.

The present method can also be used to program a non-volatile memory cell with a serially connected select transistor connected in a NOR configuration. The non-volatile memory cell has a control gate for receiving a programming voltage and the select transistor has a select gate for receiving a select voltage. The method comprises applying the programming voltage to the control gate of the non-volatile memory cell in a program command sequence. The magnitude of the select voltage to the select gate of the select transistor within the program command sequence is varied.

DETAILED DESCRIPTION OF THE INVENTION

Figure 1A:
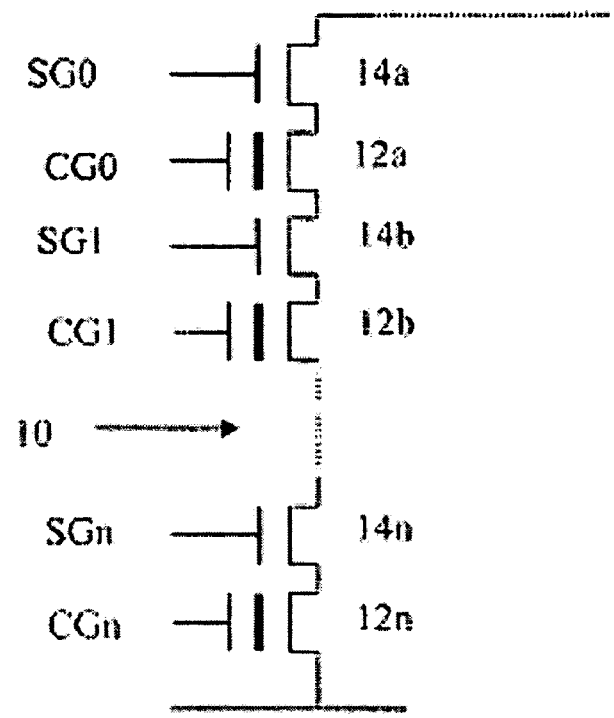
FIGS. 1A and 1B are schematic circuit diagrams of NAND structures of the prior art to which the method of the present invention may be used.

Referring to FIG. 1 there is shown a schematic circuit diagram of a NAND structure of the prior art as exemplified by the disclosure set forth in U.S. Pat. No. 6,885,586, whose disclosure is incorporated herein in its entirety. The NAND structure 10 comprises a chain of serially connected non-volatile memory cell 12 each having an associated select transistor 14. Each of the non-volatile memory cell 12 has a floating gate for storing charges, and a control gate which receives a programming voltage during a program command sequence. In addition, each non-volatile memory cell 12 has an associated select transistor 14, which is a conventional MOS transistor having a select gate. The select gate of the select transistor 14 receives a select voltage during the program command sequence. The structure 10 comprises a chain of the serially connected non-volatile memory cell 12 each with an associated select transistor 14. Thus, the source/drain of the select transistor SG0 or select transistor 14a is at one end of the NAND structure 10. The other source/drain of the select transistor 14a is connected to the source/drain of its associated non-volatile memory cell 12a. The other source/drain of the non-volatile memory cell 12a is connected to the source/drain of the select transistor SG1 or transistor 14b, and so on. The final end of the NAND structure 10 is the source/drain of the non-volatile memory cell 12n.

In the prior art, during programming, a program command sequence occurs in which a programming voltage is applied to the control gate of a select non-volatile memory cell 12, e.g. cell 12b. A static, non-varying, select voltage is applied to the gate SG of the associated select transistor 14, e.g. 14b. After the program command sequence, the cell, 12b, is verified to determine if programming occurred correctly by reading the select non-volatile memory cell 12b. If the readout indicates that the cell 12b has been correctly programmed, then the program command sequence ends. However, if the readout indicates that programming did not successfully occur, then the programming voltage applied to the control gate of the select non-volatile memory cell 12b is increased. Again, the voltage on the select gate of the associated transistor 14b is maintained at a static, non-varying level. The voltage supplied to the associated select gate, however, remains the same. The sequence of programming and verification continues until the selected non-volatile memory cell 12b is successfully programmed.

Figure 1B:
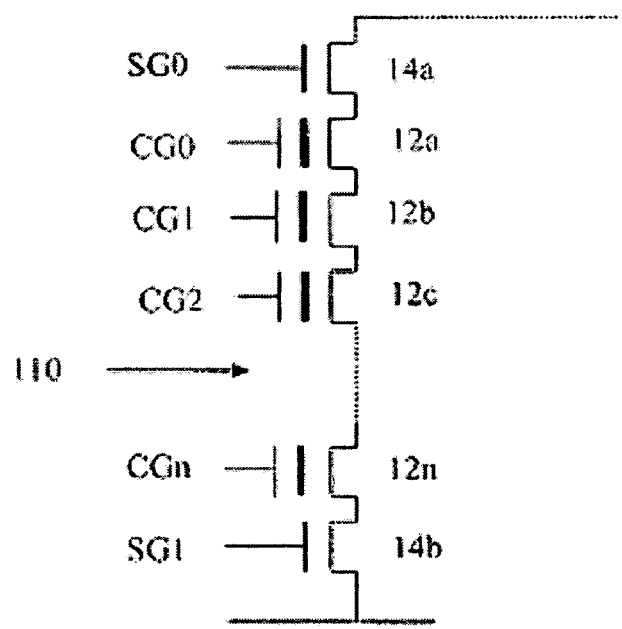

Referring to FIG. 1B, there is shown another NAND structure 110 of the prior art. This NAND structure 110 is disclosed in U.S. Pat. Nos. 4,959,812 and 5,050,125 whose disclosures are incorporated herein in their entirety. The NAND structure 110 is similar to the NAND structure 10 shown in FIG. 1A in that it comprises a plurality of serially connected non-volatile memory cells 12. However, only a select transistor 14a and a select transistor 14n are electrically connected at the ends of the serially connected non-volatile memory cells 12a-12n. Finally, for the NAND structure 110, during programming, the programming voltage is applied to the control gate of the selected non-volatile memory cell 12k.

Figure 2:
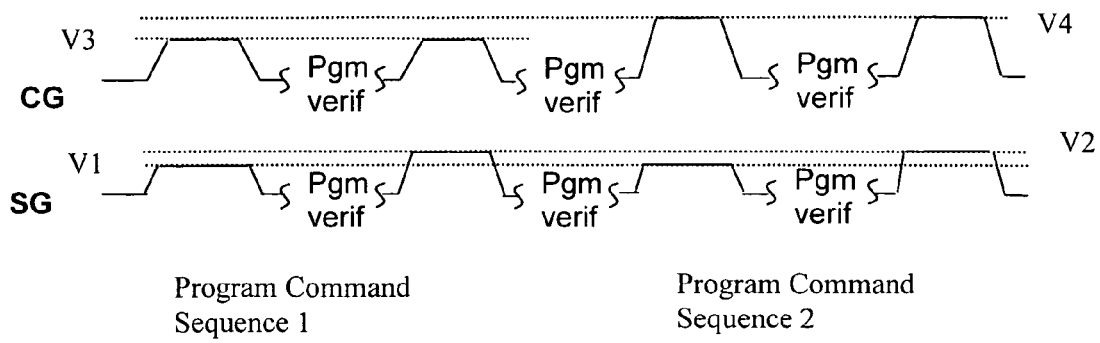
FIG. 2 is a timing diagram of a first embodiment of the method of the present invention.

Referring to FIG. 2 there is shown a timing diagram of a first embodiment of the method of the present invention. The method of the present invention can be used with either the NAND structure 10 or the NAND structure 110. Thus, as used herein, the term "serially connected non-volatile memory cells" shall mean either directly connected non-volatile memory cells 12a-12b-12c- . . . 12n as shown in FIG. 1B or indirectly connected non-volatile memory cells 14a-12a-14b-12b-14c-12v . . . 12n as shown in FIG. 1A. Further the method of the present invention can also be used with a NOR structure comprising a single non-volatile floating gate memory cell 12 and its associated select transistor 14.

In FIG. 2, two program command sequences are shown. In a first program sequence, two pulses or more of the programming voltage, each having a maximum voltage of V3 are applied to the control gate of the select non-volatile memory cell. During that entire program sequence, two pulses or more of the select voltage are applied. The first pulse has a maximum voltage of V1 and the second pulse has a maximum voltage of V2. After the first program command sequence, the cell is verified or is read to determine if it has been correctly programmed. If not, the second program command sequence is initiated. During the second program command sequence, the program voltage applied to the control gate is increased from V3 to V4. Again, during this program command sequence, the select voltage applied to the SG gate of the select transistor is varied from V1 to V2. In both of the program command sequences, the voltages applied to the control gate are step function like pulses. Similarly, the voltages applied to the select gate are also step function like pulses.

Figure 3:
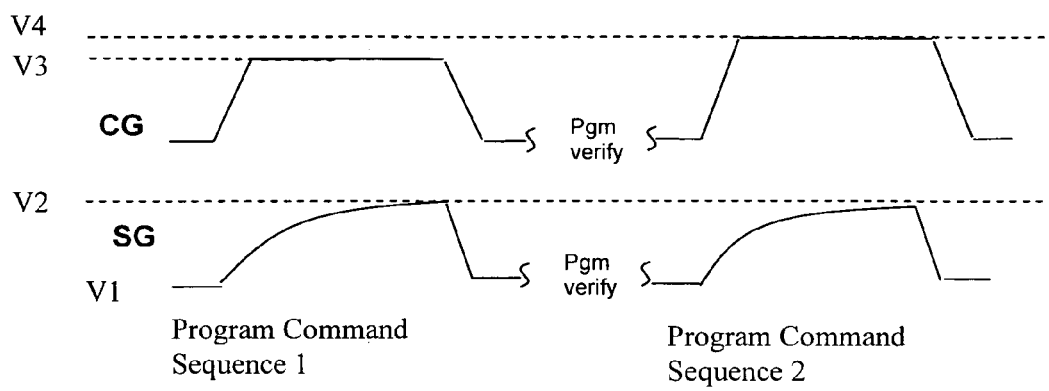
FIG. 3 is a timing diagram of a second embodiment of the method of the present invention.

Referring to FIG. 3, there is shown a timing diagram of a second embodiment of the method of the present invention. Similar to the timing diagram shown in FIG. 2, two program command sequences are shown. In a first program command sequence, unlike the program command sequence shown in FIG. 2, the programming voltage applied to the control gate is a single step like function pulse, in contrast to the plurality of pulses shown in FIG. 2. The programming voltage reaches the level of V3 in the program command sequence 1 and reaches a level of V4 in the program command sequence 2. During the first program sequence, the select voltage to the select gate begins at a low level, such as ground potential (or V1) and ramps up to a high level voltage such as V2. This is in contrast to the program command sequence 1 wherein the select voltage to the select gate are pulse like voltages in changes from V1 to V2. In the method shown in FIG. 3, the select voltage is a ramping voltage which varies continuously from a low voltage such as V1 to a high voltage, V2. The rate at which the voltage ramps from V1 to V2 can vary. The rate can be tuned for optimal efficiency depending on the NAND structure. After the program command sequence 1 is finished, verification and read-out is performed. Again, if verification shows that the cell has not properly programmed, then in the program command sequence 2, the program voltage to the control gate is increased to level V4 in a single step function pulse. During the program command sequence 2, the voltage applied to the select gate is similar to the voltage applied during the first program command sequence wherein the select voltage ramps up from a low value V1 to $V_2$.

Figure 4:
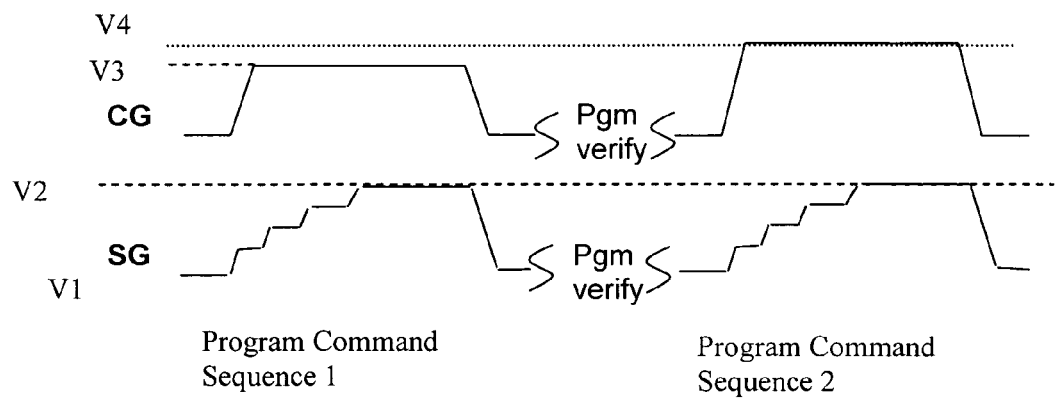
FIG. 4 is a timing diagram of a third embodiment of the method of the present invention.

Referring to FIG. 4 there is a timing diagram of a third embodiment of the method of the present invention. In the third embodiment, the programming voltages applied to the control gate in the first and second program command sequences are identical to those shown in FIG. 3. During each of the program command sequence, the programming voltage applied to the control gate consist of a single step function like pulse. In the first program command sequence, the pulse reaches a voltage V3. In the second program command sequence, the pulse reaches a level of V4. However, during the first program command sequence, the select voltage applied to the select gate varies in a plurality of step functions which is a step up from a previous one until the maximum V2 voltage is obtained. The duration at each step and the height of each step can be varied. Similar to the first and second method of the present invention, after the first program command sequence, if verification shows that the cell has not been programmed correctly, then the programming voltage applied to the control gate is increased to V4 and the ramping step voltage applied to the select gate as done for the first program command sequence is again used during the second command sequence.

Figure 5:
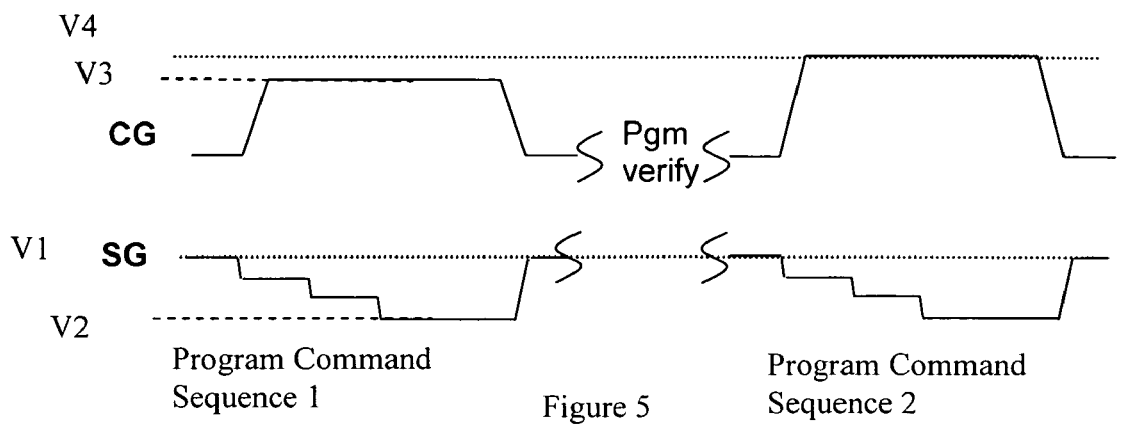
FIG. 5 is a timing diagram of a fourth embodiment of the method of the present invention.

Referring to FIG. 5 there is shown a timing diagram of a fourth embodiment of the present invention. In the method shown in FIG. 5, which is similar to the timing diagram shown in FIG. 4, during the program command sequence, the select voltage is ramped down in a serious of steps starting at a high level voltage V1 stepping down to a low level voltage of V2 and then ramping back up to V1. In all other aspects, the fourth embodiment of the method of the present invention as shown by the timing diagram in FIG. 5 is identical to the third method of the present invention shown by the timing diagram in FIG. 4. Of course, another embodiment of the present invention is where the select voltage is continuously ramped down similar to the embodiment shown in FIG. 3 where the voltage is continuously ramped up.

Figure 6:
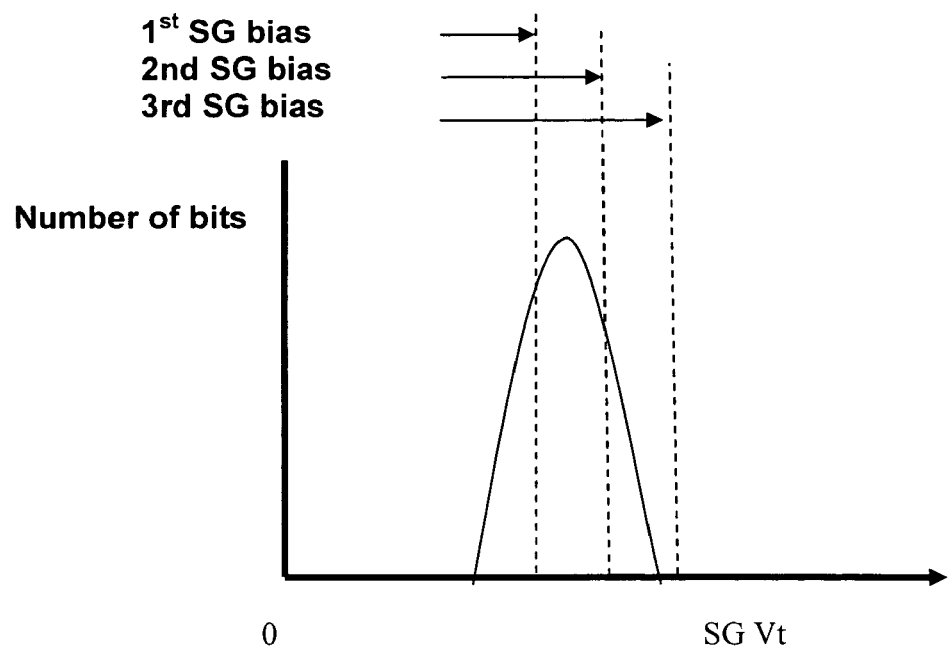
FIG. 6 is a plot of voltage versus the number of bits showing the theoretical basis for the method of the present invention.

The theoretical basis for the method of the present invention is as follows. Referring to FIG. 6, there is shown a diagram of the select voltage applied to the select gate versus the number of bits that program by that particular level voltage. As can be seen by the diagram shown in FIG. 6, there is a gaussian distribution of the number of bits that can be programmed depending upon the select voltage. Further as can be seen from FIG. 6, when the voltage of the select gate is first applied it is at a lower select voltage. For certain cells, that may be enough to program that cell (such variances depend upon process conditions etc.). However, for other cells it may be necessary to increase the select gate voltage. Thus by incrementally increasing the select gate during each of the subsequent program command sequences, the select cell will eventually be programmed stronger by the select voltage. The SG bias voltage and the SG threshold voltage difference will result in weak programming. Using one fixed and high SG bias will result in slow programming of low SG Vt cells as well as the majority of the population.

The further advantage of the method of the present invention is that it helps to limit the total current programming operation. During the lower select voltage, the cell program current is lower and faster programming bits will be programmed earlier than the majority of the population. After these cells have reached a programmed state, they will conduct less programming current so the rest of the bits will receive more supply from the charge pump to achieve a better programming. Further, faster programming results with better process variation tolerance and better programming yield in addition to tighter programmed cell vt distribution with no over-program induced failures are other advantages of the present invention.

What is claimed is:

1. A method of programming a select non-volatile memory cell having an associated select transistor, wherein said non-volatile memory cell having a control gate for receiving a programming voltage and wherein said select transistor having a select gate for receiving a select voltage, said method comprising:

applying said programming voltage to said control gate of said select non-volatile memory cell in a program command sequence, said program command sequence comprising a plurality of separate pulses of programming voltage applied to said control gate of said select non-volatile memory cell, and a plurality of separate pulses of select voltage applied to said select gate of said select transistor, each pulse of select voltage corresponding to a pulse of programming voltage; and varying the magnitude of each of said separate pulses of said select voltage to said select gate of said select transistor during said program command sequence.

2. A method of programming a select non-volatile memory cell having an associated select transistor, wherein said select non-volatile memory cell having a control gate for receiving a programming voltage and wherein said select transistor having a select gate for receiving a select voltage, said method comprising:

applying a single pulse of programming voltage applied to said control gate of said select non-volatile memory cell; and continuously ramping up said select voltage until a maximum is reached.

3. A method of programming a select non-volatile memory cell having an associated select transistor, wherein said select non-volatile memory cell having a control gate for receiving a programming voltage and wherein said select transistor having a select gate for receiving a select voltage, said method comprising:

applying a single pulse of programming voltage applied to said control gate of said select non-volatile memory cell; and increasing said select voltage in a plurality of steps that increase in magnitude.

4. A method of programming a select non-volatile memory cell having an associated select transistor, wherein said select non-volatile memory cell having a control gate for receiving a programming voltage and wherein said select transistor having a select gate for receiving a select voltage, said method comprising:

applying a single pulse of programming voltage applied to said control gate of said select non-volatile memory cell; and continuously ramping down said select voltage until a minimum is reached.

5. A method of programming a select non-volatile memory cell having an associated select transistor, wherein said select non-volatile memory cell having a control gate for receiving a programming voltage and wherein said select transistor having a select gate for receiving a select voltage, said method comprising:

applying a single pulse of programming voltage applied to said control gate of said select non-volatile memory cell; and decreasing said select voltage in a plurality of steps that decrease in magnitue.

6. The method of claim 1, 2, 3, 4 and 5 wherein said select non-volatile memory cell is in a plurality of serially connected non-volatile memory cells with the plurality of serially connected non-volatile memory cells having the associated select transistor serially connected thereto.

7. The method of claim 6 wherein said associated select transistor is serially electrically connected between a pair of non-volatile memory cells, and wherein said associated select transistor is immediately adjacent to and is directly and serially connected to said select non-volatile memory cell.

8. The method of claim 1, 2, 3, 4 and 5 wherein said select non-volatile memory cell is directly and serially connected to the associated select transistor.

* * * * *